(12) United States Patent
Tsang

(10) Patent No.: US 7,990,212 B1
(45) Date of Patent: Aug. 2, 2011

(54) MODULATED AUDIO AMPLIFIER OUTPUT ENABLE CONTROL

(75) Inventor: Robin Matthew Tsang, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 12/641,524

(22) Filed: Dec. 18, 2009

(51) Int. Cl.
*H03F 1/14* (2006.01)

(52) U.S. Cl. .......................................... 330/51; 330/254

(58) Field of Classification Search .............. 330/51, 330/254, 279
See application file for complete search history.

(56) References Cited

U.S. PATENT DOCUMENTS

| | | | |
|---|---|---|---|
| 6,472,935 B2 * | 10/2002 | King et al. ........................ | 330/51 |
| 6,501,331 B2 * | 12/2002 | Adar ................................. | 330/51 |
| 6,538,590 B1 | 3/2003 | Gaboriau et al. | |
| 7,224,218 B1 | 5/2007 | Jiang et al. | |
| 7,259,619 B2 * | 8/2007 | Chang et al. ..................... | 330/51 |
| 7,554,399 B1 | 6/2009 | Gaboriau et al. | |
| 7,554,409 B1 | 6/2009 | Zhang et al. | |
| 7,570,118 B1 | 8/2009 | Gaboriau et al. | |
| 7,782,138 B2 * | 8/2010 | Dally et al. ..................... | 330/279 |

OTHER PUBLICATIONS

National Semiconductor, "LM4766 Datasheet", Mar. 2006, US.
U.S. Appl. No. 12/493,054, filed Jun. 26, 2009, Tsang et al.

* cited by examiner

*Primary Examiner* — Henry K Choe
(74) *Attorney, Agent, or Firm* — Andrew M. Harris; Mitch Harris, Atty at Law, LLC

(57) ABSTRACT

A modulated amplifier output enable control eliminates audible pops when enabling and disabling an audio amplifier output stage. The output of the audio amplifier is transitioned between an enabled state and a disabled state using a modulated control signal that enables and disables the output of the audio amplifier. Durations of the enabled state vs. the disabled state of the amplifier are adjusted to cause a transition between a fully disabled state and a fully enabled state of the audio amplifier so that the transition between the disabled state and the enabled state of the amplifier output is inaudible.

21 Claims, 5 Drawing Sheets

MODULATED AUDIO AMPLIFIER OUTPUT ENABLE CONTROL

BACKGROUND OF THE INVENTION

1. Field of the Invention

The present invention relates generally to control of audio amplifier outputs, and more specifically, to techniques for disabling and enabling audio amplifier outputs by modulating between enabled and disabled states.

2. Background of the Invention

Audio amplifiers typically exhibit pops due to changes in output levels when power is applied and the output is otherwise disabled or enabled. The output offset can be due to internal offsets in the amplifier and/or due to offset present in the input signal that is passed to the output of the amplifier. With present-day headphone amplifiers having very low signal output requirements due to highly efficient headphone designs, such as in-ear headphones, even a relatively small step in the output voltage of the headphone amplifier can generate an audible pop.

One way in which pops have been reduced or eliminated in previous amplifier designs is by controlling the bias of the transistors in the amplifier output stage according to a ramp waveform, such as that provided by the charging of a capacitor with a bias reference current that is internally mirrored to set the quiescent current levels in the amplifier output stage.

However, an amplifier that responds to such analog control is generally more complicated than a digital approach that merely disables and enables the output stage by completely disabling/enabling the transistors in the amplifier output stage and in some applications and circuit topologies, a binary control signal may be the only option for controlling the enable/disable state of the amplifier output.

Therefore, it would be desirable to provide techniques for disabling and enabling an audio amplifier output stage in which binary output stage control may be used while avoiding the generation of audible pops.

SUMMARY OF THE INVENTION

The above stated objective of providing an audio amplifier control that enables/disables the amplifier without generating pops is accomplished in a circuit and method. The method is a method of operation of the circuit.

The circuit is an audio output stage including an amplifier with a control circuit that enables and disables the output of the audio output stage using a modulated control signal. Durations of states of the control signal corresponding to a disabled and an enabled state of the audio amplifier output are adjusted to cause a transition between the completely enabled state and the completely disabled state of the audio output stage, so that audible pops are avoided.

The control signal may enable and disable pre-driver transistors that supply the bias voltages to the gates of the output stage transistors, or the bias voltages may be selectively clamped by switches coupled to the gates of the output stage transistors. Alternatively, the power supply rails to the output stage transistors may be selectively disabled by controlling power supply control transistors to disable current supplied to the amplifier output transistors.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

The present invention encompasses audio circuits that include analog audio output stages that can be selectively enabled and disabled, in which a modulated enable/disable profile is used to gradually transition between the enabled and disabled states. The result is that the voltage offset of the audio output is gradually introduced when the output stage is enabled and gradually removed when the output stage is disabled, rather than generating an abrupt voltage transition at the output, which would otherwise result in an audible pop.

Figure 1:
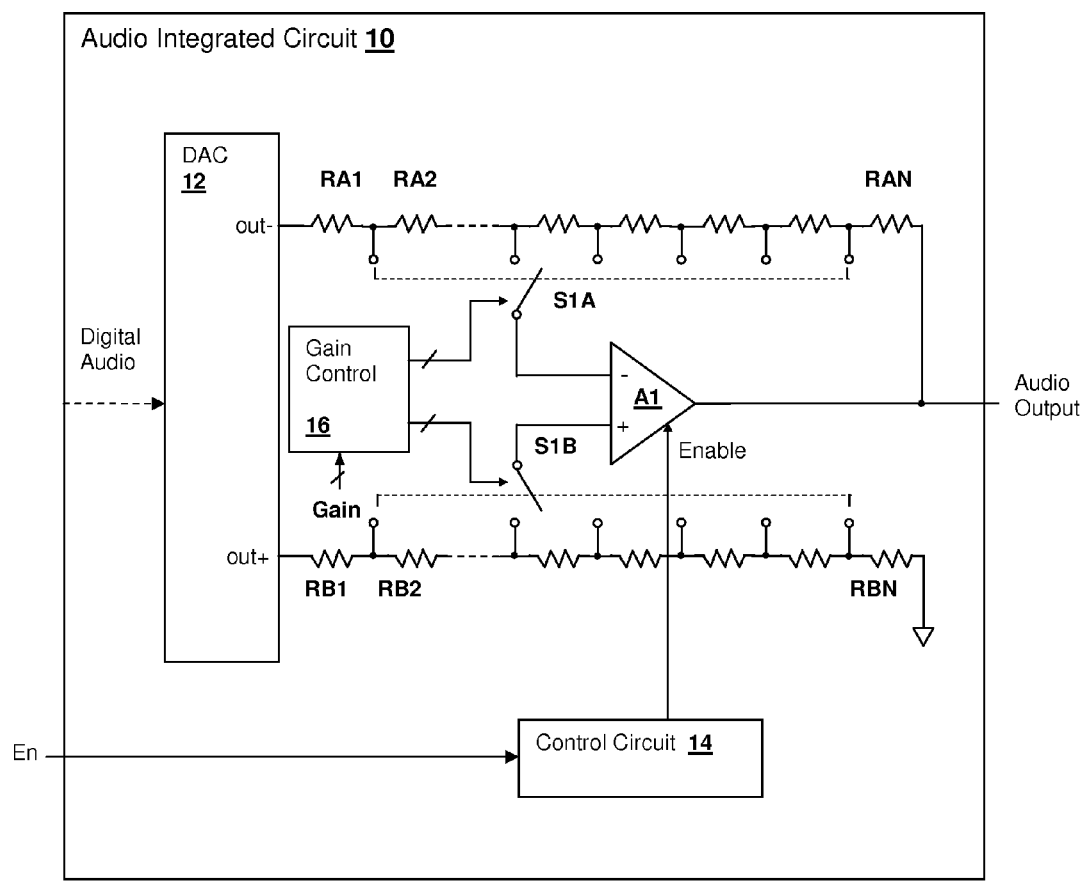
FIG. 1 is a block diagram depicting an audio integrated circuit 10 in accordance with an embodiment of the present invention.

Referring now to FIG. 1, an audio integrated circuit 10, in accordance with an embodiment of the present invention, is shown. An amplifier A1 receives a differential output of a digital-to-analog converter (DAC) 12 provided from terminals out+ and out−. The differential output of DAC 12 is multiplied by a gain or attenuation factor to generate audio output signal Audio Output. Resistors RA1-RAN provide a resistor chain with a switch position selected by switch element S1A and resistors RB1-RBN provide another resistor chain with a switch position selected by switch element S1B. Switch element S1A and S1B are ganged, i.e., they are set to identical switch positions, so that a differential amplifier is formed having a gain/attenuation magnitude set by the ratio of the total resistance (of resistors and other components) between the output of amplifier A1 and the selected switch position and the total resistance between the selected switch position and the corresponding output of DAC 12. Therefore the switch position selected by gain control 16 sets the gain of the output stage of audio integrated circuit 10 formed by amplifier A1. In the depicted embodiment, gain control 16 generally sets a fixed gain or a variable gain settable by a gain value Gain provided as an input to gain control 16. However, gain control 16 may use modulation techniques to eliminate zipper noised as disclosed in co-pending U.S. patent application Ser. No. 12/493,054 entitled "MODULATED GAIN AUDIO CONTROL AND ZIPPER NOISE SUPPRESSION TECHNIQUES USING MODULATED GAIN", the disclosure of which is incorporated herein by reference and having at least one common inventor with and assigned to the same Assignee as the present application.

As pointed out in the above-incorporated U.S. patent application, the relatively large number of resistors needed to provide fine gain control raises the amount of offset present, since the resistors must be physically smaller to fit within a given area and physically smaller resistors have greater resistance, generating greater common-mode offset appearing at the output of amplifier A1. Further, any mismatch between the resistors in the two resistor chains formed by resistors RA1-RAN and resistors RB1-RBN, respectively, will cause an additional offset in the output of amplifier A1 if there is offset present at the inputs of amplifier A1. Any source of offset at the input of amplifier A1 can cause a pop when the selected gain/attenuation level is changed. Further, when the output of amplifier A1 is enabled or disabled, by changing the state of a control signal Enable, if any offset is present at the output of amplifier A1 the offset of audio output signal Audio Output will change. That is, the DC offset of audio output signal Audio Output is either removed in the disabled state or is generated in the enabled state of amplifier A1, and the sudden change in the offset voltage will generate a pop.

Unique to audio integrated circuit 10 of FIG. 1, in accordance with various embodiments of the present invention, is that control circuit 14, which provides control signal Enable to an enable input of amplifier A1, modulates the state of control signal Enable in order to cause a smooth transition between the enabled state and the disabled state of amplifier A1, whenever amplifier A1 is being enabled or disabled. When an enable input signal En changes state, control circuit 14 adjusts relative proportions of durations for which the enabled state and the disabled state of control signal Enable are generated and applied to amplifier A1. Changes in the proportions of the durations are introduced gradually to transition between a fully-enabled state and a fully-disabled state. The proportions of the enabled and disabled state of control signal Enable are set by the time durations that are varied from 0% to 100% in steps as fine as the modulation technique within control circuit 14 permits.

Without the techniques of the present invention, a voltage step will be generated at the output of amplifier A1 and therefore will be produced in audio output signal Audio Output when amplifier A1 is enabled or disabled. Therefore, the present invention provides that physically smaller resistors can be used to implement the gain control resistor chains formed by resistors RA1-RAN and resistors RB1-RBN, since the transition technique of the present invention reduces or eliminates pops that had previously dictated offset limits that determine the size of the resistors. Without the techniques of the present invention, physically larger resistors will generally be required in such circuits to reduce mismatches that cause circuit offsets, or alternatively the pops must be tolerated, or further alternatively the amplifier must remain enabled, which is not desirable in low-power devices. The result can be a substantial die area savings, since the resistors can occupy a significant amount of the total die area.

Audio integrated circuit 10 is only one example of a circuit in which techniques of the present invention may be applied. For example, the techniques of the present invention may be applied in purely analog audio circuits and in digital or analog circuits having internal audio sources with no external audio inputs and in which the enable/disable state to be applied to amplifier A1 is determined entirely internal to an integrated circuit containing amplifier A1. Further, while audio output signal Audio Output is generally illustrative of an audio output for providing signals to a low power headphone device and/or providing a line level output, the techniques of the present invention can be applied to higher-power or lower-power audio amplifier circuits in which output offset generates pops when the amplifier output is enabled and/or disabled.

Figure 2A:
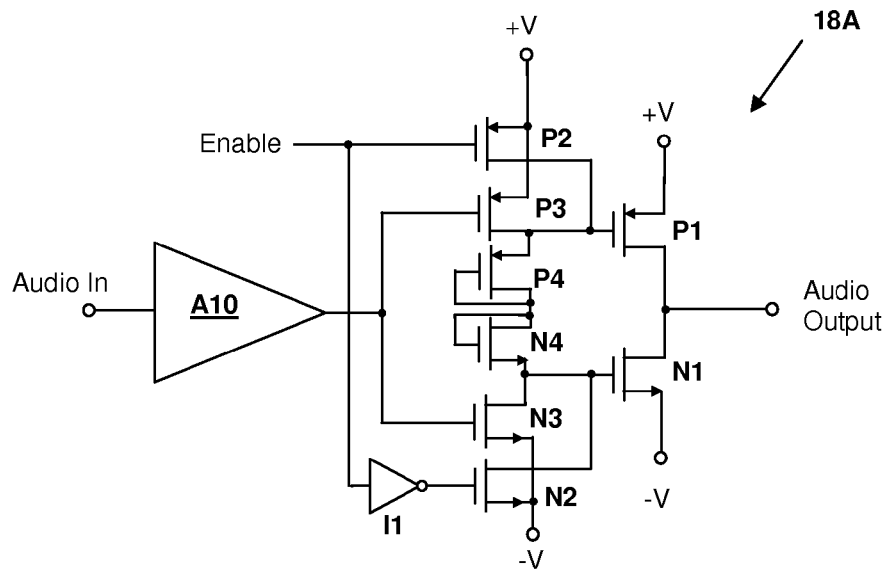
FIG. 2A is a schematic diagram depicting an audio amplifier 18A that may be used to implement amplifier A1 of FIG. 1, in accordance with an embodiment of the present invention.

Referring now to FIG. 2A, an amplifier 18A that may be used to implement amplifier A1 of FIG. 1, is shown in accordance with an embodiment of the invention. Amplifier 18A has an output stage for generating audio output signal Audio Output, provided by transistors P1 and N1. A preamplifier circuit A10 receives an audio input Audio In, which may be a differential input as illustrated in FIG. 1, and provides a drive signal to the gates of pre-driver transistors P3 and N3 that provide audio drive signals to transistors P1 and N1. Transistors P4 and N4 provide offsets at the gates of transistors P1 and N1 to provide class AB operation. Transistors P2 and N2 are clamp transistors that, when activated, clamp the gates of transistors P1 and N1 to power supply rails +V and −V, respectively, in order to disable amplifier 18A. Transistor P2 is operated from control signal Enable, and transistor N2 is operated from an inverted version of control signal Enable as provided by an inverter I1. It is understood that control signal Enable should have an enable state approximately equal to the voltage of power supply rail +V and a disable state sufficient to turn on transistor P2, and that the output of inverter I1 should have an enable state approximately equal to the voltage of power supply rail −V and a disable state sufficient to turn on transistor N2. Amplifier 18A is an example of an amplifier circuit that includes clamps that directly control the quiescent (bias) voltages of the output state transistors.

Figure 2B:
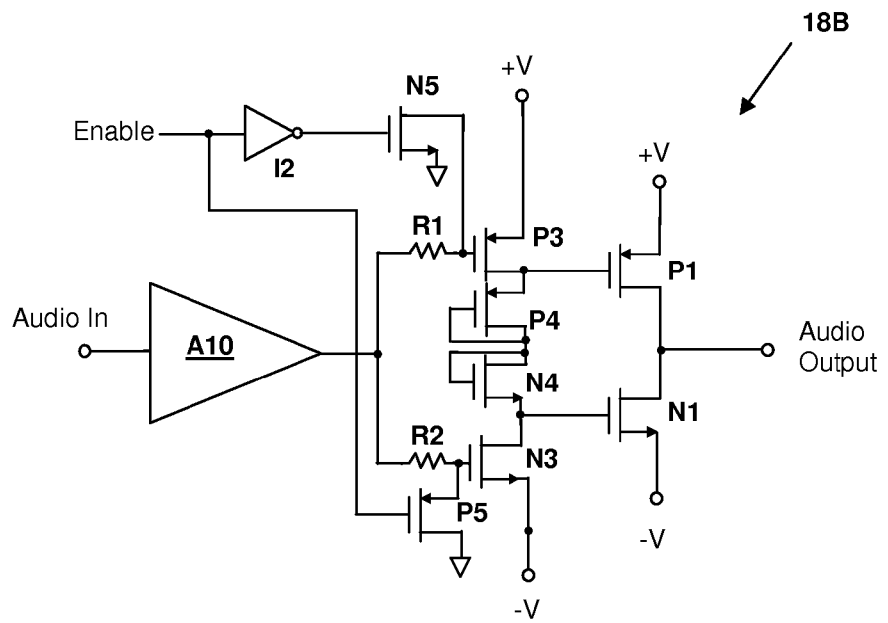
FIG. 2B is a schematic diagram depicting an audio amplifier 18B that may be used to implement amplifier A1 of FIG. 1, in accordance with another embodiment of the present invention.

Referring now to FIG. 2B, an amplifier 18B that may be used to implement amplifier A1 of FIG. 1, is shown in accordance with an alternative embodiment of the invention. Amplifier 18B is an example of an amplifier in which the bias voltages of the output stage transistors is controlled indirectly. Amplifier 18B is similar to amplifier 18A and therefore only differences between them will be described below. Amplifier 18B includes transistors N5 and P5, which alter the operating points of pre-driver transistors P3 and N3, when control signal Enable is de-asserted, so that pre-driver transistors P3 and N3 act as clamps similar to the action of transistors P2 and N2 in amplifier 18A. Control signal Enable can generally be a logic level signal, and an inverter I2 that generates an inverted control signal can be a logic inverter. Resistors R1 and R2 are provided to prevent the output of preamplifier A10 from being shorted to ground, when amplifier 18B is disabled, although generally, in low-power applications, the output of preamplifier A10 will also be disabled and resistors R1 and R2 may not be required.

Figure 2C:
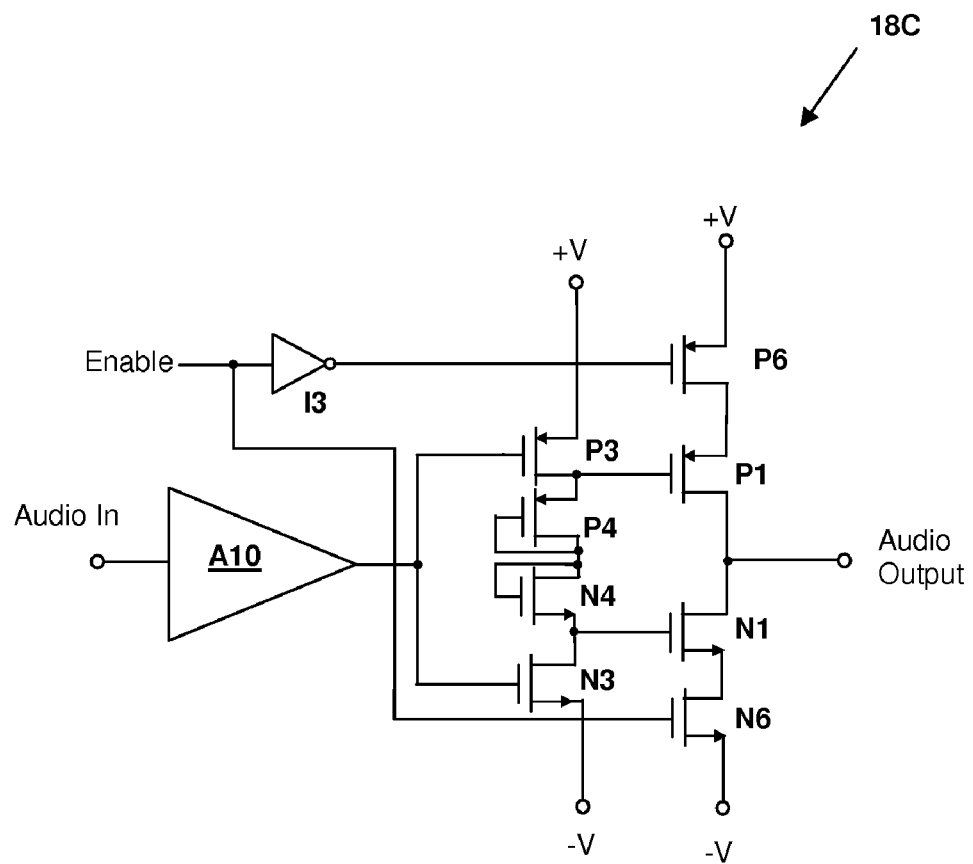
FIG. 2C is a schematic diagram depicting an audio amplifier 18C that may be used to implement amplifier A1 of FIG. 1, in accordance with yet another embodiment of the present invention.

Referring now to FIG. 2C, an amplifier 18C that may be used to implement amplifier A1 of FIG. 1, is shown in accordance with yet another alternative embodiment of the invention. Amplifier 18C is an example of an amplifier in which the power supplies provided to the output stage transistors are interrupted. Amplifier 18C is similar to amplifiers 18A and 18B, and therefore only differences between them will be described below. Amplifier 18C includes transistors N6 and P6, which turn off the current paths to power supply rails −V and +V, respectively, when control signal Enable is de-asserted. It is understood that control signal Enable should have a disable state approximately equal to the voltage of power supply rail −V and that the output of inverter I3 requires a disable state approximately equal to the voltage of power supply rail +V. However, the output swing required to control transistors N6 and P6 can generally be small. When control signal Enable is asserted, transistors N6 and P6 are turned off, resulting in no current flow through transistors P1 and N1 effectively disabling amplifier 18C.

While the above-described circuits provide a framework in which the techniques of the present invention may be applied, such examples are not limiting, and it is the operation of control circuit 14 that provides the modulated enable control techniques of the present invention, which will be illustrated in further detail below.

Figure 3A:
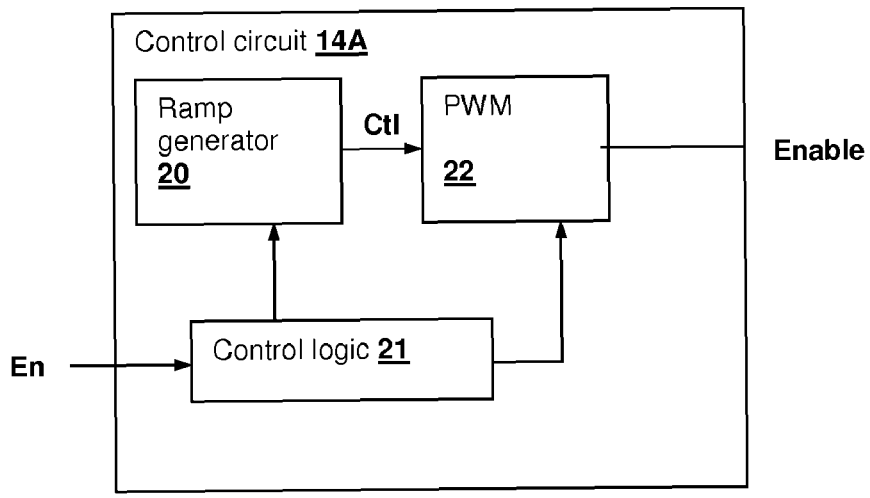
FIG. 3A is a block diagram depicting a control circuit 14A that may be used to implement control circuit 14 of FIG. 1, in accordance with an embodiment of the present invention.

Referring now to FIG. 3A, a control circuit 14A that may be used to implement control circuit 14 of FIG. 1, is shown in accordance with an embodiment of the present invention. Control circuit 14A includes a ramp generator 20 that generates an enable/disable state change profile Ctl when triggered by a control logic 21 in response to input enable signal En. A pulse-width modulator (PWM) 22 receives the output of ramp generator 20, and generates control signal Enable, which is modulated at a rate much higher than the audible frequency range, such as 3 Mhz, so that transitions between the enabled state and the disabled state of amplifier A1 in FIG. 1 are not audible. Further, it is not a requirement that the response of amplifier A1 to the frequency of modulation be enough to cause amplifier A1 to transition between the completely enabled and the completely disabled state, as any averaging caused by a band-limited response to control signal Enable, will still provide a smooth transition between the disabled and enabled states of amplifier A1.

The one-shot enable/disable control profile generated by ramp generator may be linear, or may assume a non-linear shape tailored to further reduce audio artifacts. Once the ramp has completed the transition in either direction, in response to input enable signal En changing state, the output of PWM 22 will remain in the final state (0% corresponding to amplifier disabled or 100% corresponding to amplifier enabled) that reflects the state commanded by input enable signal En.

Figure 3B:
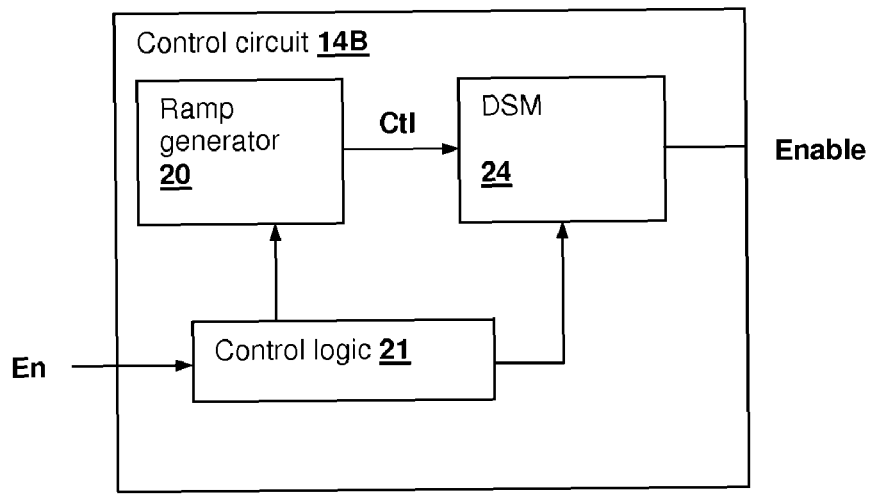
FIG. 3B is a block diagram depicting a control circuit 14B that may be used to implement control circuit 14 of FIG. 1, in accordance with another embodiment of the present invention.

Referring now to FIG. 3B, a control circuit 14B that may be used to implement control circuit 14 of FIG. 1, is shown in accordance with an embodiment of the present invention. Control circuit 14B is similar to control circuit 14A of FIG. 3A, and therefore only differences between them will be described below. In control circuit 14B, a delta-sigma modulator (DSM) 24 is used to control the state of control signal Enable, in which the average value of a noise-shaped pseudo-random output of DSM is determined by the output value of ramp generator 20. At endpoints of the output of ramp generator 20, i.e., after a ramp transition completes and prior to the first state change of enable input signal En, the output of DSM 24 is clamped at the fully enabled (logic "1") or fully disabled (logic "0") state. During the transition, the average durations of the states of control signal Enable follow the value of the output of ramp generator 20, but vary to spread the spectrum of any tones produced during the transition.

Figure 4:
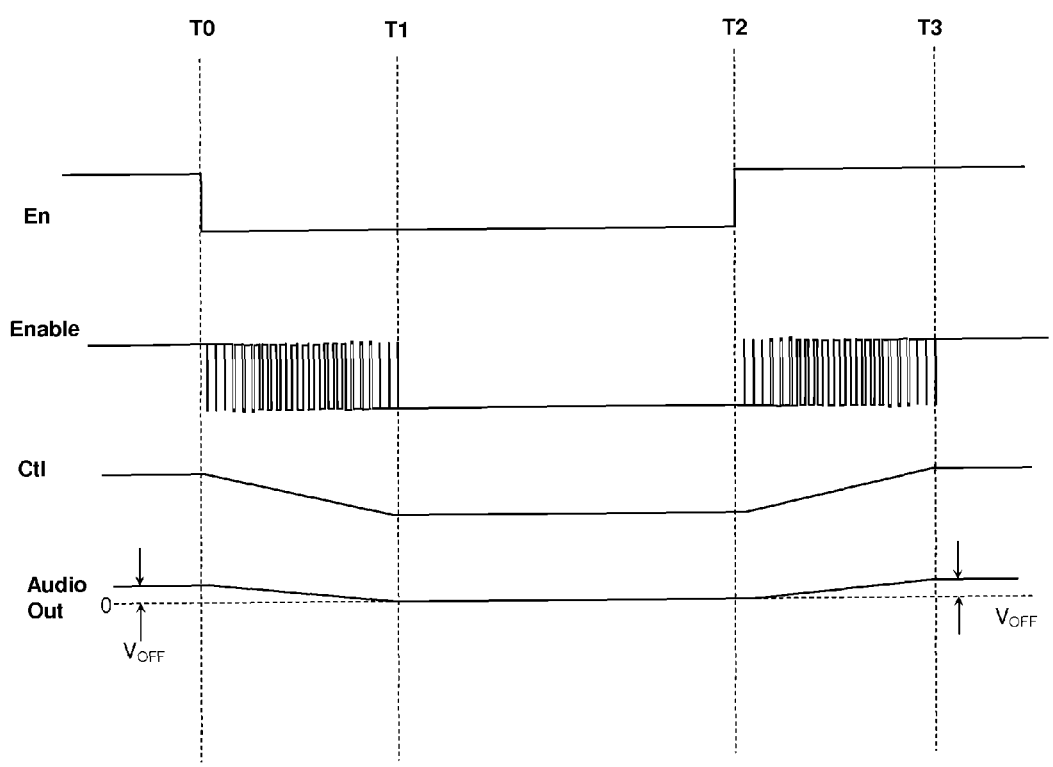
FIG. 4 is a signal waveform diagram illustrating operation of the audio integrated circuit of FIG. 1.

Referring now to FIG. 4, signal waveforms illustrating the above-described operation are shown. Waveform Audio Out illustrates a voltage of audio output signal Audio Output. At time T0, the offset voltage of waveform Audio Out is $V_{OFF}$. Also at time T0, input enable signal En is de-asserted to command control logic 14 to disable the output of amplifier A1. Ramp generator output Ctl transitions to a low voltage state during the interval from time T0 to time T1, during which control signal Enable transitions at a high frequency rate, with the proportion of the enabled state decreasing over the interval and the proportion of the disabled state increasing over the interval, until a fully-disabled state is reached. Also during the interval, the offset voltage of amplifier A1 gradually decreases, as shown, so that no audible pop is produced. While the illustration of FIG. 4 exemplifies operation of an analog-controlled PWM controller, the control of the modulator may be digital, and therefore an equivalent binary or other digital representation may be present in place of analog ramp generator output Ctl, while providing the same functionality in adjusting the pulse widths of the enable and disable states of control signal Enable.

At time T2, input enable signal En is asserted to command control logic 14 to re-enable the output of amplifier A1. Ramp generator output Ctl transitions to a high voltage state during the interval from time T2 to time T3, during which control signal Enable transitions at a high frequency rate, with the proportion of the enabled state increasing over the interval and the proportion of the disabled state decreasing over the interval, until a fully-enabled state is reached. Also during the interval, the offset voltage of amplifier A1 gradually increases from zero to the offset voltage $V_{OFF}$, as shown, so that no audible pop is produced.

While the invention has been particularly shown and described with reference to the preferred embodiments thereof, it will be understood by those skilled in the art that the foregoing and other changes in form and details may be made therein without departing from the spirit and scope of the invention.

What is claimed:

1. A method of controlling the output of an audio amplifier, the method comprising:
   receiving an indication to enable or disable the output of the audio amplifier;
   controlling the output of the audio amplifier between an enabled state and a disabled state using a control signal that enables and disables the output of the audio amplifier;
   transitioning between the disabled state and the enabled state of the audio amplifier in response to the indication, by modulating the control signal according to an enabled state duration and a disabled state duration respectively corresponding to the enabled state and the disabled state of the audio amplifier; and
   adjusting the enabled state duration and the disabled state duration to cause a transition between a fully disabled state and a fully enabled state of the audio amplifier, whereby audible transients caused by changing whether the audio amplifier is in the disabled state or the enabled state are reduced or eliminated.

2. The method of claim 1, wherein the controlling controls one or more bias voltages at gate terminals of one or more first transistors providing the output of the amplifier, wherein the disabled state of the control signal turns the one or more first transistors off, and wherein the enabled state of the control signal permits the one or more first transistors to respond to an audio signal.

3. The method of claim 2, wherein the controlling enables and disables one or more second transistors having drain-source connections coupled between power supply rails and one or more corresponding gate terminals of the one or more first transistors, wherein the disabled state of the control signal turns on the one or more second transistors to set the one or more bias voltages substantially equal to corresponding supply rails of the audio amplifier, and wherein the enabled state of the control signal turns off the one or more second transistors.

4. The method of claim 3, further comprising providing the audio signal to the one or more first transistors from one or more pre-driver transistors, and wherein the one or more second transistors are bias control transistors provided in addition to the one or more pre-driver transistors and having drain-source connections coupled in parallel with the drain-source connections of the one or more second transistors.

5. The method of claim 3, wherein the one or more second transistors are pre-driver transistors, and wherein the method further comprises providing the audio signal to the one or more first transistors from one or more pre-driver transistors.

6. The method of claim 1, wherein the controlling controls one or more power supply control transistors having drain-source connections coupled in series between one or more corresponding power supply rails and drain-source connections of the one or more first transistors, wherein the enabled state of the control signal turns on the one or more power supply control transistors to enable the audio amplifier and turns off the one or more power supply control transistors to disable the audio amplifier.

7. The method of claim 1, wherein the adjusting adjusts the corresponding durations of the control signal between the enabled state and the disabled state according to a linear transition slope.

8. The method of claim 1, wherein the enabled state duration and the disabled state duration are determined according to a pulse width modulation scheme.

9. The method of claim 1, wherein the enabled state duration and the disabled state duration are determined according to a delta-sigma modulation scheme.

10. An audio amplifier circuit, comprising:
    an audio output stage comprising one or more first transistors for supplying current from corresponding power supply rails; and
    a control circuit for controlling whether the one or more first transistors is in an enabled or disabled state in response to a control signal, wherein the control circuit controls a transition between a disabled state and an enabled state of the audio output stage by modulating the control signal according to a disabled state duration corresponding to the disabled state of audio output stage and an enabled state duration corresponding to the enabled state of the audio output stage, wherein the control circuit adjusts the enabled state duration and the disabled state duration to cause a transition between a fully disabled state and a fully enabled state of the audio output stage, whereby audible transients caused by changing whether the audio output stage is in the disabled state or the enabled state are reduced or eliminated.

11. The audio amplifier circuit of claim 10, wherein the control circuit controls one or more bias voltages at gate terminals of the one or more first transistors, wherein the disabled state of the control signal turns the one or more first transistors off, and wherein the enabled state of the control signal permits the one or more first transistors to respond to an audio signal.

12. The audio amplifier circuit of claim 11, further comprising one or more second transistors having drain-source connections coupled between corresponding power supply rails of the audio amplifier and one or more corresponding gate terminals of the one or more first transistors, wherein the disabled state of the control signal turns on the one or more second transistors to set the one or more bias voltages substantially equal to the corresponding power supply rails of the audio amplifier.

13. The audio amplifier circuit of claim 11, further comprising one or more pre-driver transistors for coupling the audio signal to the one or more first transistors, and wherein the one or more second transistors are bias control transistors provided in addition to the one or more pre-driver transistors and having drain-source connections coupled in parallel with the drain-source connections of the one or more second transistors.

14. The audio amplifier of claim 11, wherein the one or more second transistors are pre-driver transistors for coupling the audio signal to the one or more first transistors.

15. The audio amplifier of claim 10, further comprising one or more power supply control transistors having drain-source connections coupled in series between one or more corresponding power supply rails and drain-source connections of the one or more first transistors, wherein the enabled state of the control signal turns on the one or more power supply control transistors to enable the audio amplifier and turns off the one or more power supply control transistors to disable the audio amplifier.

16. The audio amplifier circuit of claim 10, wherein control circuit adjusts the corresponding durations of the control signal between the enabled state and the disabled state according to a linear transition slope.

17. The audio amplifier circuit of claim 10, wherein the control circuit comprises a pulse width modulator for generating the control signal, and wherein the control circuit adjusts a pulse width of an output of the pulse width modulator.

18. The audio amplifier circuit of claim 10, wherein the control circuit comprises a delta-sigma modulator for generating the control signal, and wherein control circuit adjusts an average pulse width of an output of the delta-sigma modulator.

19. An integrated circuit, comprising:
    an audio output stage having an enable input; and
    a control circuit for controlling whether the audio output stage is in an enabled or disabled state in response to a control signal, wherein the control circuit controls a transition between a disabled state and an enabled state of the audio output stage by modulating the control signal according to a disabled state duration corresponding to the disabled state of audio output stage and an enabled state duration corresponding to the enabled state of the audio output stage, wherein the control circuit adjusts the enabled state duration and the disabled state duration to cause a transition between a fully disabled state and a fully enabled state of the audio output stage, whereby audible transients caused by changing whether the audio output stage is in the disabled state or the enabled state are reduced or eliminated.

20. The integrated circuit of claim 19, wherein the control circuit controls bias voltages at gate terminals of one or more first transistors providing an output of the audio output stage, wherein the disabled state of the control signal turns the one or more first transistors off, and wherein the enabled state of the control signal permits the one or more first transistors to respond to an audio signal.

21. The integrated circuit of claim 18, wherein the audio output stage comprises one or more power supply control transistors having drain-source connections coupled in series between one or more corresponding power supply rails and drain-source connections of one or more first transistors providing an output of the audio output stage, wherein the enabled state of the control signal turns on the one or more power supply control transistors to enable the audio output stage and turns off the one or more power supply control transistors to disable the audio output stage.

* * * * *